(12) United States Patent
Shimura

(10) Patent No.: US 10,032,790 B2
(45) Date of Patent: Jul. 24, 2018

(54) SEMICONDUCTOR DEVICE

(71) Applicant: Toshiba Memory Corporation, Minato-ku (JP)

(72) Inventor: Yasuhiro Shimura, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/262,254

(22) Filed: Sep. 12, 2016

(65) Prior Publication Data

US 2017/0179150 A1   Jun. 22, 2017

Related U.S. Application Data

(60) Provisional application No. 62/268,128, filed on Dec. 16, 2015.

(51) Int. Cl.
| | |
|---|---|
| *H01L 27/115* | (2017.01) |
| *H01L 23/373* | (2006.01) |
| *H01L 23/522* | (2006.01) |
| *H01L 23/528* | (2006.01) |
| *H01L 27/11582* | (2017.01) |

(52) U.S. Cl.
CPC .... *H01L 27/11582* (2013.01); *H01L 23/3736* (2013.01); *H01L 23/5226* (2013.01); *H01L 23/5283* (2013.01)

(58) Field of Classification Search
CPC ................................................ H01L 27/11582
See application file for complete search history.

(56) References Cited

U.S. PATENT DOCUMENTS

| | | | | |
|---|---|---|---|---|
| 8,581,330 B2* | 11/2013 | Kiyotoshi | ......... | H01L 27/11582 257/324 |
| 2008/0124914 A1 | 5/2008 | Ahn | | |
| 2010/0178759 A1* | 7/2010 | Kim | .................. | H01L 27/11521 438/591 |
| 2013/0207178 A1* | 8/2013 | Lee | .................. | H01L 29/66833 257/324 |
| 2013/0234235 A1 | 9/2013 | Matsuda et al. | | |
| 2014/0295636 A1 | 10/2014 | Makala et al. | | |

FOREIGN PATENT DOCUMENTS

JP        2013-214736        10/2013

* cited by examiner

*Primary Examiner* — Moazzam Hossain
(74) *Attorney, Agent, or Firm* — Oblon, McClelland, Maier & Neustadt, L.L.P.

(57) ABSTRACT

According to one embodiment, a semiconductor device includes a substrate; a stacked body; a columnar portion; and a plate portion. The stacked body includes a plurality of electrode layers stacked with an insulator interposed. The electrode layers include first to third electrode layers. The first electrode layer is most proximal to the substrate. The second electrode layer is most distal to the substrate. The columnar portion and the plate portion are provided inside the stacked body. The plate portion extends along the stacking direction of the stacked body and along a first direction orthogonal to the stacking direction. The plate portion includes first to third portions. The third portion is provided between the first portion and the second portion. Widths of the first portion and the second portion along a second direction are narrower than a width of the third portion along the second direction.

9 Claims, 10 Drawing Sheets

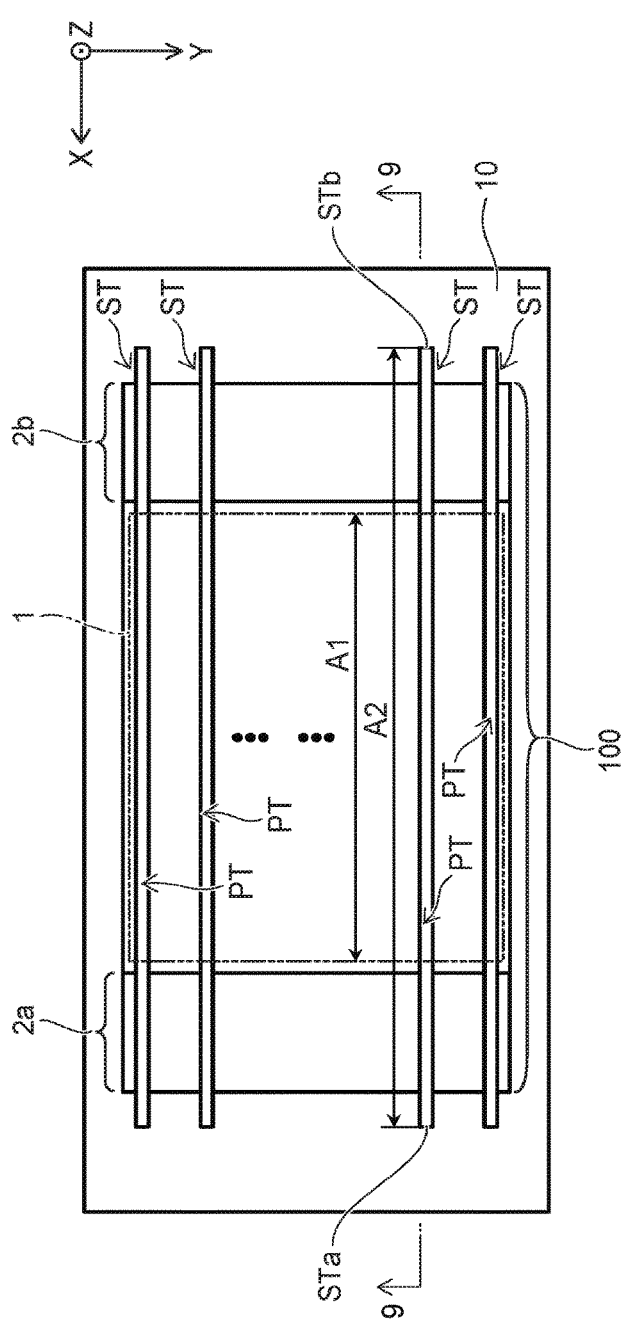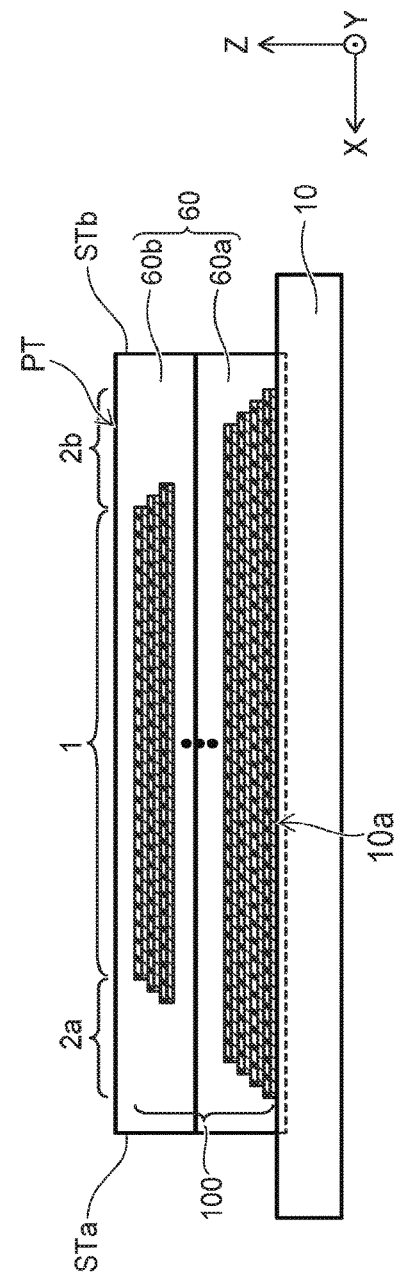

SEMICONDUCTOR DEVICE

CROSS-REFERENCE TO RELATED APPLICATIONS

This application is based upon and claims the benefit of priority from U.S. Provisional Patent Application 62/268,128 filed on Dec. 16, 2015; the entire contents of which are incorporated herein by reference.

FIELD

Embodiments described herein relate generally to a semiconductor device.

BACKGROUND

A memory device having a three-dimensional structure has been proposed in which a memory hole is made in a stacked body in which multiple electrode layers are stacked, and a charge storage film and a semiconductor film are provided to extend in the stacking direction of the stacked body inside the memory hole. The memory device includes multiple memory cells connected in series between a drain-side selection transistor and a source-side selection transistor. The electrode layers of the stacked body are gate electrodes of the drain-side selection transistor, the source-side selection transistor, and the memory cells. A slit that reaches a substrate from the upper surface of the stacked body is made in the stacked body. A conductor is filled into the slit. For example, the conductor is used to form a source line. The aspect ratio of the cross section of the slit along the minor-axis direction is large. Therefore, it is difficult to pattern the slit perpendicularly from the upper surface of the stacked body to the substrate. The width in the minor-axis direction of the slit becomes narrower in the lower layer portion (the substrate side) of the stacked body and wider in the upper layer portion (the upper surface side of the stacked body). Accordingly, the planar surface area of the electrode layer becomes wider in the lower layer portion of the stacked body and narrower in the upper layer portion of the stacked body. Thereby, a difference between the resistance values of the electrode layers of the stacked body occurs. It is desirable for the difference between the resistance values of the electrode layers to be small.

BRIEF DESCRIPTION OF THE DRAWINGS

FIG. 8 is a schematic plan view of the semiconductor device of the second embodiment;

FIG. 9 is a cross-sectional view along line 9-9 of FIG. 8;

DETAILED DESCRIPTION

Figure 1:
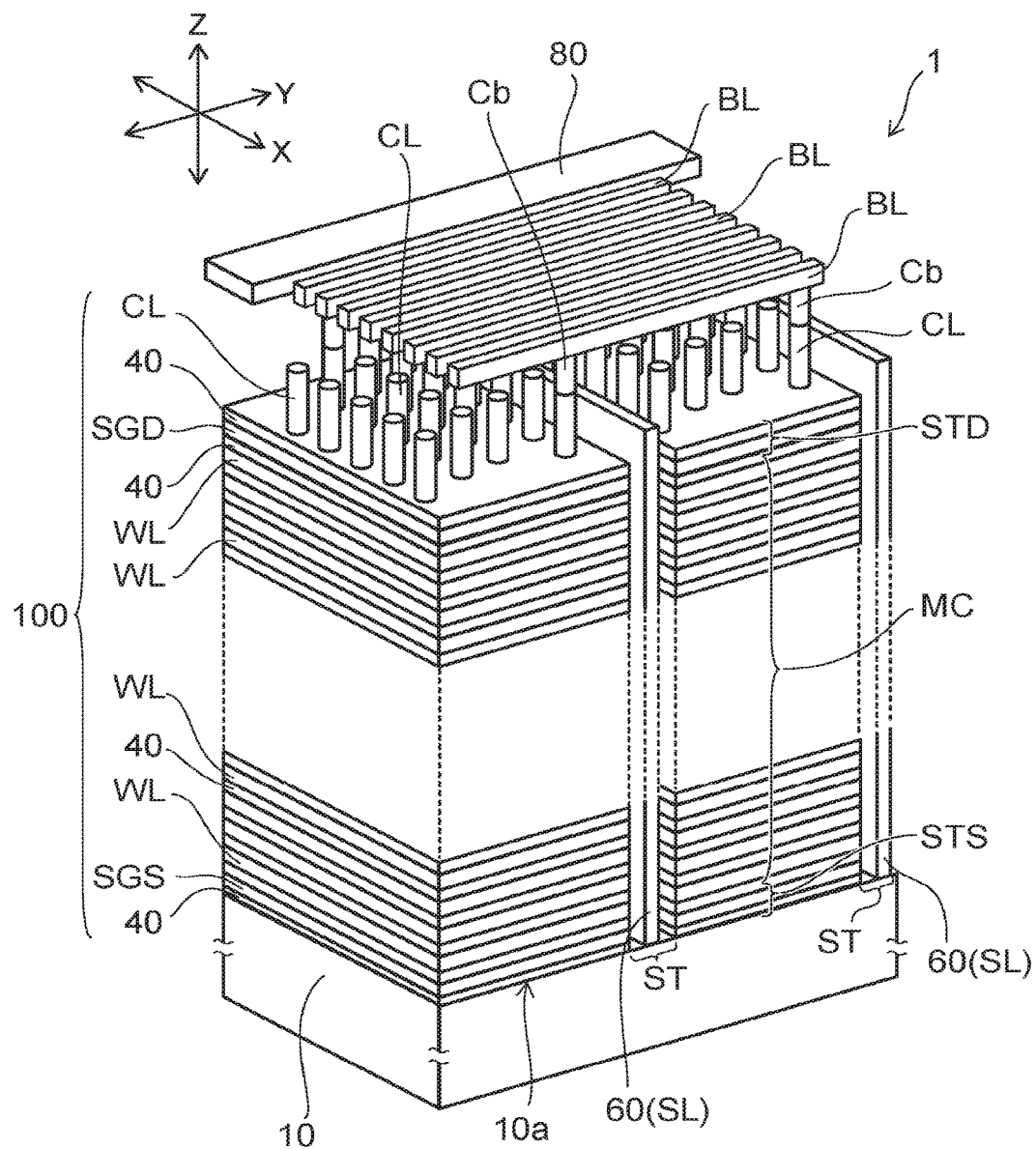
FIG. 1 is a schematic perspective view of a memory cell array of a semiconductor device of a first embodiment.

According to one embodiment, a semiconductor device includes a substrate; a stacked body; a columnar portion; and a plate portion. The substrate has a major surface. The stacked body provided on the major surface of the substrate. The stacked body includes a plurality of electrode layers stacked with an insulator interposed. The plurality of electrode layers includes a first electrode layer, a second electrode layer, and a third electrode layer. The first electrode layer is most proximal to the major surface of the substrate. The second electrode layer is most distal to the major surface of the substrate. The third electrode layer is provided between the first electrode layer and the second electrode layer. The columnar portion is provided inside the stacked body. The columnar portion extends along a stacking direction of the stacked body. The columnar portion includes a semiconductor body and a memory film. The memory film is provided between the semiconductor body and the electrode layers. The memory film includes a charge storage portion inside the film. The plate portion is provided inside the stacked body. The plate portion extends along the stacking direction of the stacked body and along a first direction orthogonal to the stacking direction. The plate portion includes a plate conductor and a sidewall insulating film. The sidewall insulating film is provided between the plate conductor and the stacked body. The plate portion includes a first portion, a second portion, and a third portion along the stacking direction of the stacked body. The third portion is provided between the first portion and the second portion. A width of the first portion along a second direction is narrower than a width of the third portion along the second direction. The second direction is orthogonal to the first direction along the major surface of the substrate. A width of the second portion along the second direction is narrower than the width of the third portion along the second direction.

Embodiments will now be described with reference to the drawings. In the respective drawings, like members are labeled with like reference numerals. Semiconductor devices of the embodiments are semiconductor memory devices having memory cell arrays.

<First Embodiment>

FIG. 1 is a schematic perspective view of a memory cell array 1 of a semiconductor device of a first embodiment. In FIG. 1, two mutually-orthogonal directions parallel to a major surface 10a of a substrate 10 are taken as an X-direction and a Y-direction. The XY plane is a planar direction of a stacked body 100. A direction orthogonal to both the X-direction and the Y-direction is taken as a Z-direction (the stacking direction of the stacked body 100). In the specification, "down" refers to a direction toward the substrate 10; and "up" refers to a direction away from the substrate 10.

As shown in FIG. 1, the memory cell array 1 includes the stacked body 100, multiple columnar portions CL, and multiple slits ST. The stacked body 100 includes a drain-side selection gate SGD, multiple word lines WL, and a source-side selection gate SGS.

The source-side selection gate (the lower gate layer) SGS is provided on the substrate 10. The substrate 10 is, for example, a semiconductor substrate. The semiconductor substrate includes, for example, silicon. The silicon that is included in the substrate 10 is monocrystalline silicon. The substrate 10 that includes the monocrystalline silicon includes a carrier in the portion where the memory cell array 1 is provided. The carrier is, for example, an acceptor. The acceptor is, for example, boron. Thereby, the conductivity type of the substrate 10 is the P-type in the portion where the memory cell array 1 is provided. The multiple word lines WL are provided on the source-side selection gate SGS. The drain-side selection gate (the upper gate layer) SGD is provided on the multiple word lines WL. The drain-side selection gate SGD, the multiple word lines WL, and the source-side selection gate SGS are electrode layers. The number of stacks of the electrode layers is arbitrary.

The electrode layers (SGD, WL, and SGS) are stacked to be separated from each other. An insulator 40 is disposed in each region between the electrode layers (SGD, WL, and SGS). The insulator 40 may be an insulator such as a silicon oxide film, etc., or may be an air gap.

At least one selection gate SGD is used as a gate electrode of a drain-side selection transistor STD. At least one selection gate SGS is used as a gate electrode of a source-side selection transistor STS. Multiple memory cells MC are connected in series between the drain-side selection transistor STD and the source-side selection transistor STS. The memory cell MC is used as a gate electrode of one word line WL.

The slit ST is provided inside the stacked body 100. The slit ST extends along the stacking direction of the stacked body 100 (the Z-direction) and a first direction (e.g., the X-direction) orthogonal to the stacking direction (the Z-direction) in the interior of the stacked body 100. The slits ST divide the stacked body 100 along a second direction (the Y-direction) orthogonal to the first direction (the X-direction) along the major surface 10a of the substrate 10. The region that is divided by the slits ST is called a "block." A plate conductor 60 is provided inside the slit ST. The plate conductor 60 includes, for example, a local interconnect such as a source line SL, etc., inside the memory cell array 1.

The columnar portion CL is provided inside the stacked body 100 divided by the slits ST. The columnar portion CL is provided inside the memory cell array 1 of the stacked body 100. The columnar portion CL extends in the stacking direction of the stacked body 100 (the Z-direction) in the interior of the stacked body 100. For example, the columnar portion CL is formed in a circular columnar configuration or an elliptical columnar configuration. For example, the columnar portion CL is arranged in a staggered lattice configuration or a square lattice configuration inside the memory cell array 1. The drain-side selection transistor STD, the multiple memory cells MC, and the source-side selection transistor STS are disposed in the columnar portion CL.

Multiple bit lines BL are disposed above the upper end portions of the columnar portions CL. The multiple bit lines BL extend in the Y-direction. The upper end portion of the columnar portion CL is electrically connected to one of the bit lines BL via a contact portion Cb. One bit line is electrically connected to one columnar portion CL selected from each block.

Figure 2:
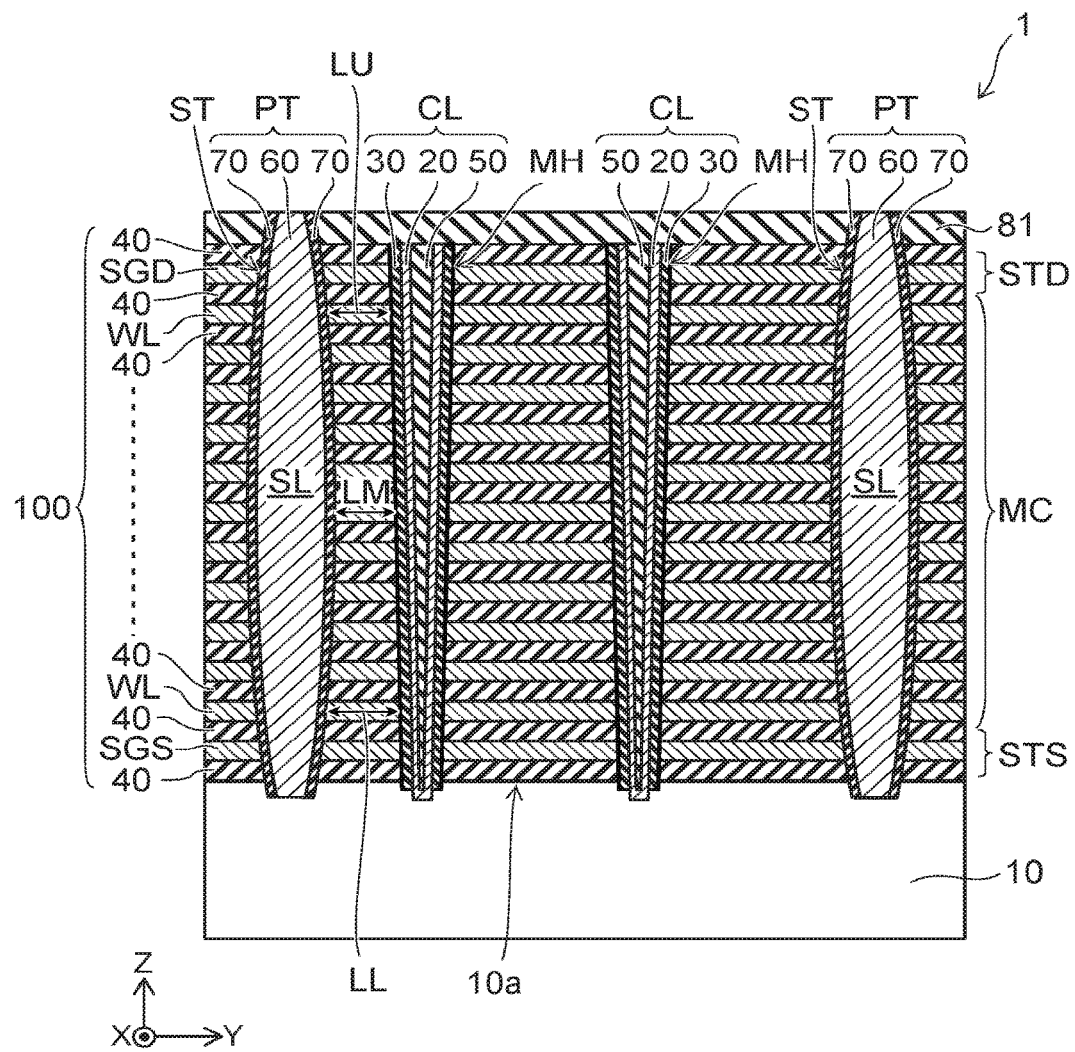
FIG. 2 is a schematic cross-sectional view of the memory cell array of the semiconductor device of the first embodiment.
Figure 3:
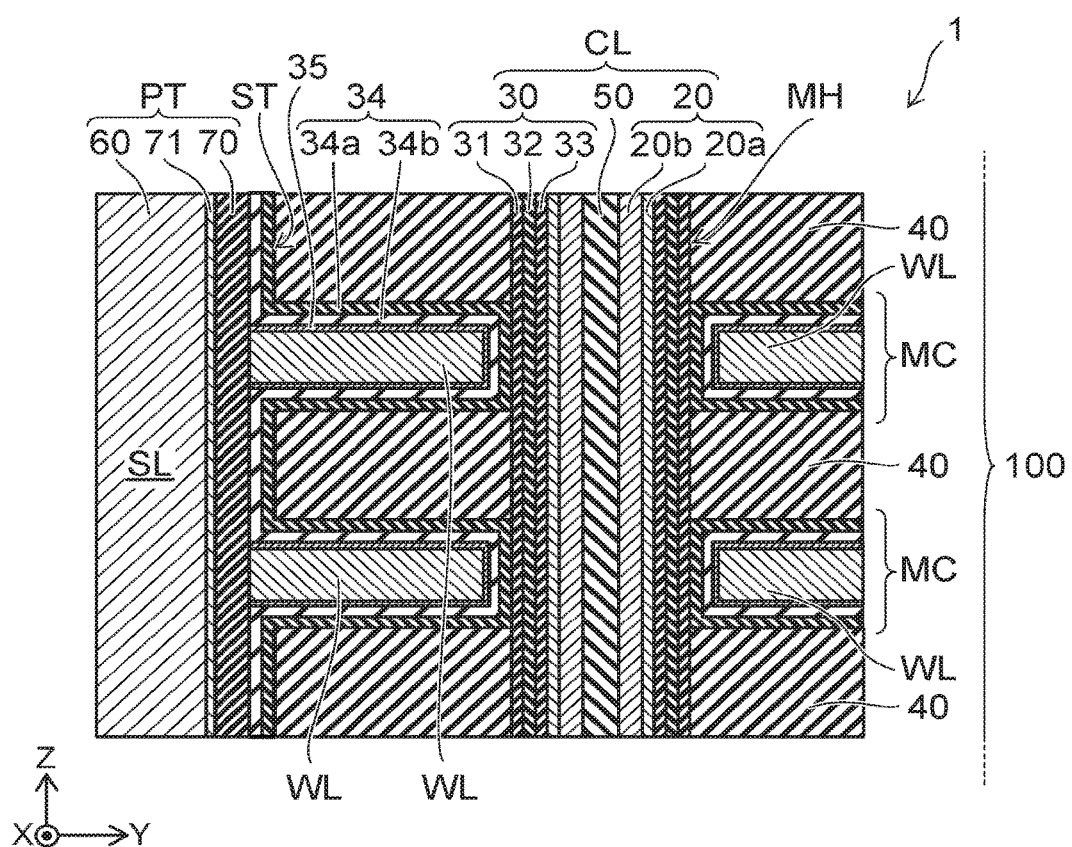
FIG. 3 is a schematic cross-sectional view in which the cross section shown in FIG. 2 is enlarged.

FIG. 2 is a schematic cross-sectional view of the memory cell array 1 of the semiconductor device of the first embodiment. FIG. 2 corresponds to a cross section parallel to the Y-Z plane of FIG. 1. The bit lines BL are not shown in FIG. 2. FIG. 3 is a schematic cross-sectional view in which the cross section shown in FIG. 2 is enlarged. FIG. 3 shows an extracted portion between the columnar portion CL and the slit ST. The memory cells MC are shown in FIG. 3.

As shown in FIG. 2, the columnar portion CL is provided inside a memory hole (a hole) MH. The memory hole MH is provided inside the memory cell array 1 of the stacked body 100. The memory hole MH extends along the stacking direction of the stacked body 100 (the Z-direction) inside the stacked body 100. The columnar portion CL includes a memory film 30, a semiconductor body 20, and a core layer 50.

The memory film 30 is provided on the inner wall of the memory hole MH. The configuration of the memory film 30 is, for example, a tubular configuration. As shown in FIG. 3, the memory film 30 includes a cover insulating film 31, a charge storage film 32, and a tunneling insulating film 33.

The cover insulating film 31 is provided on the inner wall of the memory hole MH. The cover insulating film 31 includes, for example, silicon oxide. For example, the cover insulating film 31 protects the charge storage film 32 from the etching when forming the electrode layers (SGD, WL, and SGS).

The charge storage film 32 is provided on the cover insulating film 31. The charge storage film 32 includes, for example, silicon nitride. Other than silicon nitride, the charge storage film 32 may include hafnium oxide. The charge storage film 32 has trap sites that trap charge inside the film. The charge is trapped in the trap sites. The threshold of the memory cell MC changes due to the existence/absence or amount of the charge trapped inside the charge storage film 32. Thereby, the memory cell MC stores information.

The tunneling insulating film 33 is provided on the charge storage film 32. For example, the tunneling insulating film 33 includes silicon oxide, or silicon oxide and silicon nitride. The tunneling insulating film 33 is a potential barrier between the charge storage film 32 and the semiconductor body 20. Tunneling of the charge occurs in the tunneling insulating film 33 when the charge is injected from the semiconductor body 20 into the charge storage film 32 (a programming operation) and when the charge is discharged from the charge storage film 32 into the semiconductor body 20 (an erasing operation).

As shown in FIG. 2 and FIG. 3, the semiconductor body 20 is provided on the memory film 30. The semiconductor body 20 of the first embodiment includes a cover layer 20a and a channel layer 20b. The cover layer 20a is provided on the tunneling insulating film 33. The configuration of the cover layer 20a is, for example, a tubular configuration. The channel layer 20b is provided on the cover layer 20a. The configuration of the channel layer 20b is, for example, a tubular configuration having a bottom. The cover layer 20a and the channel layer 20b include, for example, silicon. The silicon is, for example, polysilicon made of amorphous silicon that is crystallized. The conductivity type of the silicon is, for example, the P-type. For example, the semiconductor body 20 is electrically connected to the substrate 10.

The core layer 50 is provided on the semiconductor body 20. The core layer 50 is insulative. The core layer 50 includes, for example, silicon oxide. The configuration of the core layer 50 is, for example, a columnar configuration.

The memory hole MH is filled with the memory film 30, the semiconductor body 20, and the core layer 50. An insulating film 81 is formed on the stacked body 100 and the memory hole MH. The insulating film 81 includes, for example, silicon oxide. The insulating film 81 covers the memory hole MH and protects the memory film 30, the semiconductor body 20, and the core layer 50 from the processes, e.g., etching processes, etc., performed subsequently.

A blocking insulating film 34 is provided on the insulator 40, between the insulator 40 and the electrode layers (SGD, WL, and SGS), and between the memory film 30 and the electrode layers (SGD, WL, and SGS). For example, the blocking insulating film 34 suppresses back-tunneling of the charge from the word line WL into the charge storage film 32 in the erasing operation. The blocking insulating film 34 of the first embodiment includes a first blocking insulating layer 34a and a second blocking insulating layer 34b. For example, the first blocking insulating layer 34a is provided on the insulator 40 and the cover insulating film 31. For example, the second blocking insulating layer 34b is provided on the first blocking insulating layer 34a. The relative dielectric constant of the second blocking insulating layer 34b is higher than the relative dielectric constant of the first blocking insulating layer 34a. Thereby, the back-tunneling of the charge can be suppressed better compared to the case of the first blocking insulating layer 34a. For example, the first blocking insulating layer 34a includes silicon oxide. The second blocking insulating layer 34b includes metal oxide. The metal oxide is, for example, aluminum oxide. The aluminum oxide is, for example, alumina ($Al_2O_3$).

The electrode layers (SGD, WL, and SGS) are provided on the blocking insulating film 34 with a barrier film 35 interposed in the interior of the stacked body 100. The electrode layers (SGD, WL, and SGS) include, for example, tungsten. The electrode layers (SGD, WL, and SGS) surround the periphery of the columnar portion CL. For example, the barrier film 35 includes titanium nitride, or titanium nitride and titanium.

In the first embodiment, the slit ST is provided inside the insulating film 81 and the stacked body 100. A plate portion PT is provided inside the slit ST. The plate portion PT includes the plate conductor 60, a sidewall insulating film 70, and a barrier film 71. The sidewall insulating film 70 is provided between the stacked body 100 and the plate conductor 60. The sidewall insulating film 70 includes, for example, silicon oxide. The configuration of the sidewall insulating film 70 is a frame-like configuration having the major axis along the X-direction and the minor axis along the Y-direction. The barrier film 71 is provided between the sidewall insulating film 70 and the plate conductor 60. For example, the barrier film 71 includes titanium, or titanium and titanium nitride. The plate conductor 60 is provided on the barrier film 71. The plate conductor 60 includes, for example, tungsten. The plate conductor 60 is, for example, the source line SL. The configuration of the source line SL is a plate configuration having the major axis along the X-direction and the minor axis along the Y-direction. The source line SL is insulated from the stacked body 100 by the sidewall insulating film 70. For example, the source line SL is electrically connected to the substrate 10 via the barrier film 71.

Figure 4:
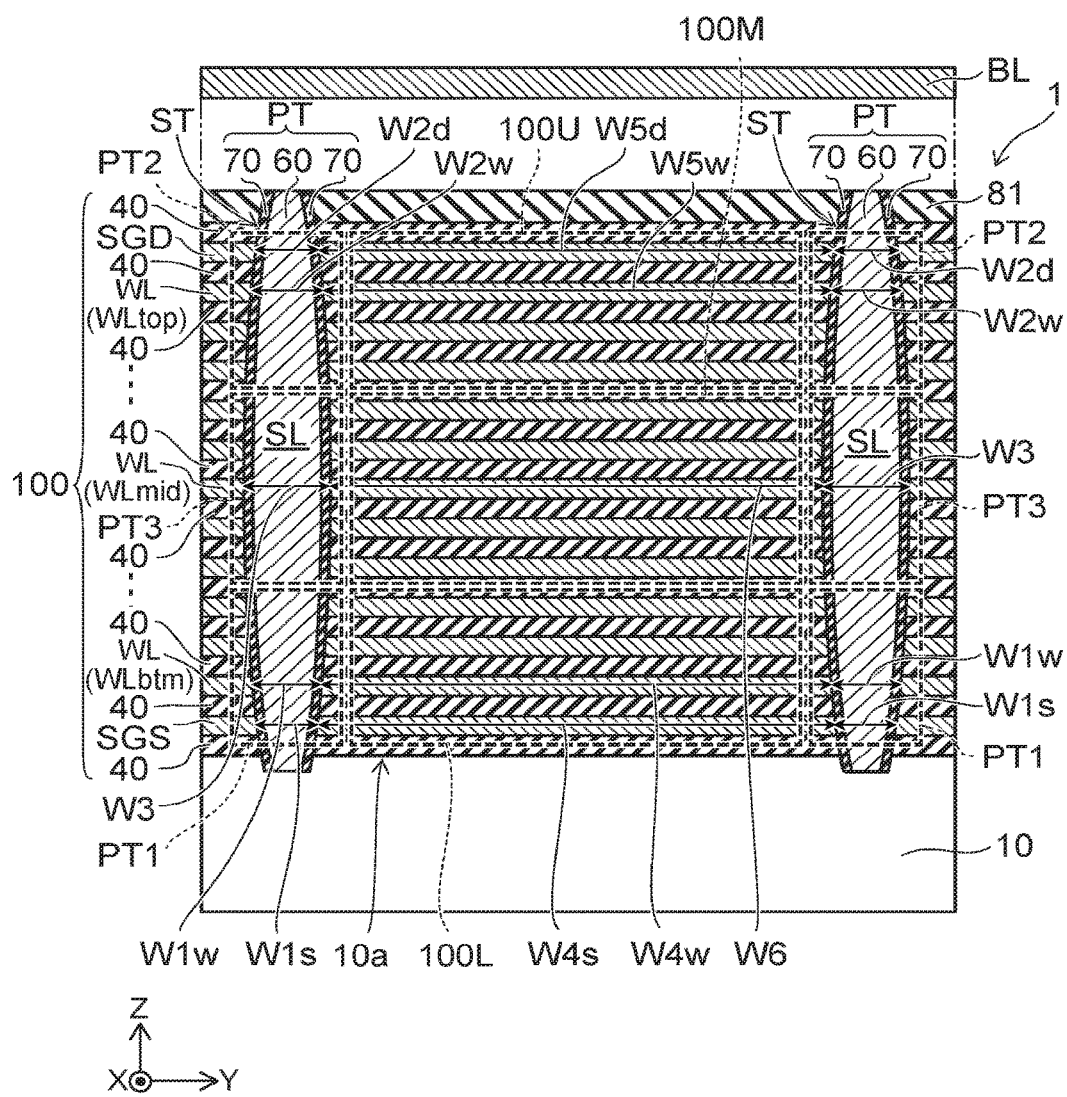
FIG. 4 is a schematic cross-sectional view of the memory cell array of the semiconductor device of the first embodiment.

FIG. 4 is a schematic cross-sectional view of the memory cell array 1 of the semiconductor device of the first embodiment. The cross section shown in FIG. 4 corresponds to the cross section shown in FIG. 2. The memory hole MH is not shown in FIG. 4.

The cross-sectional configuration of the plate portion PT parallel to the Y-Z plane includes a bowed configuration. In the plate portion PT having the bowed configuration, the middle portion of the plate portion PT bulges. In the first embodiment, the cross section that is parallel to the Y-Z plane is along the Y-direction. The Y-direction is, for example, the direction in which the bit lines BL extend. The direction in which the bit lines BL extend is the column direction. Conversely, the electrode layers, i.e., the drain-side selection gate SGD, the word lines WL, and the source-side selection gate SGS, extend in the X-direction orthogonal to the Y-direction along the major surface 10a of the substrate 10. The X-direction is the row direction.

The plate portion PT includes a first portion PT1, a second portion PT2, and a third portion PT3 along the stacking direction of the stacked body 100 (the Z-direction). The third portion PT3 is provided between the first portion PT1 and the second portion PT2. The third portion includes the middle portion where the plate portion PT bulges most.

The stacked body 100 includes a first electrode layer (SGS), a second electrode layer (SGD), and a third electrode layer (WL). The first electrode layer is most proximal to the major surface 10a of the substrate 10. In the first embodiment, the first electrode layer is the source-side selection gate SGS. The second electrode layer is most distal to the major surface 10a of the substrate 10. In the first embodiment, the second electrode layer is the drain-side selection gate SGD. The third electrode layer is provided between the source-side selection gate SGS and the drain-side selection gate SGD. In the first embodiment, the third electrode layer is the word line WL.

The stacked body 100 includes a lower layer portion 100L, an upper layer portion 100U, and a middle portion 100M. The lower layer portion 100L includes, for example, the source-side selection gate SGS. The upper layer portion 100U includes, for example, the drain-side selection gate SGD. The middle portion 100M includes, for example, the word line WL. The number of stacks of the electrode layers (SGS and WL) of the lower layer portion 100L is arbitrary. Similarly, the number of stacks of the electrode layers (SGD and WL) of the upper layer portion 100U and the number of stacks of the electrode layers (WL) of the middle portion 100M also are arbitrary.

The first portion PT1 of the plate portion PT is adjacent to the lower layer portion 100L. The second portion PT2 is adjacent to the upper layer portion 100U. The third portion PT3 is adjacent to the middle portion 100M.

In the first embodiment, widths W1 (W1s and W1w) of the first portion PT1 of the plate portion PT along the Y-direction are narrower than a width W3 of the third portion PT3 of the plate portion PT along the Y-direction (W1 (W1s and W1w)<W3). In the first portion PT1, the width W1s is narrower than the width W1w. The width W1s is the width of the first portion PT1 along the Y-direction in the same plane as the source-side selection gate SGS. The width W1w is the width of the first portion PT1 along the Y-direction in the same plane as a lowermost word line (hereinbelow, called the bottom word line) WLbtm. The bottom word line WLbtm is provided above the source-side selection gate SGS. The width W3 is, for example, the width of the portion of the third portion PT3 having the widest width. In the specification, the word line WL in the same plane as the portion having the widest width is called a word line WLmid.

Widths W2 (W2d and W2w) of the second portion PT2 along the Y-direction also are narrower than the width W3 (W2 (W2d and W2w)<W3). In the second portion PT2, the width W2*d* is narrower than the width W2*w*. The width W2*d* is the width of the second portion PT2 along the Y-direction in the same plane as the drain-side selection gate SGD. The width W2*w* is the width of the second portion PT2 along the Y-direction in the same plane as an uppermost word line (hereinbelow, called the top word line) WLtop. The top word line WLtop is provided below the drain-side selection gate SGD.

Also, for example, the widths (W1, W2, and W3) of the plate portion PT along the Y-direction become wider continuously along the Z-direction from the major surface 10*a* of the substrate 10 toward the third portion PT3. Further, the widths (W1, W2, and W3) become narrower continuously along the Z-direction from the third portion PT3 toward the upper surface of the stacked body 100. In the third portion PT3, for example, the position where the widening and narrowing of the width W3 of the plate portion PT switches is the position where the width W3 of the plate portion PT is a maximum. The position of the maximum is, for example, the position where the word line WLmid exists. The position where the word line WLmid exists is set arbitrarily in the third portion PT3.

Also, in the first embodiment, the widths of the electrode layers, e.g., the widths (W4*w*, W5*w*, and W6) of the word lines WL, along the Y-direction between the plate portion PT and the plate portion PT are as follows.

The width W4*w* is the width of a word line WL inside the lower layer portion 100L. For example, the width W4*w* is the width of the bottom word line WLbtm. The width W5*w* is the width of a word line WL inside the upper layer portion 100U. For example, the width W5*w* is the width of the top word line WLtop. The width W6 is the width of a word line WL inside the middle portion 100M. For example, the width W6 is the width of the word line WLmid.

In the first embodiment, the width W4*w* of the bottom word line WLbtm is wider than the width W6 of the word line WLmid. Similarly, the width W5*w* of the top word line WLtop also is wider than the width W6 of the word line WLmid. The width W6 of the word line WLmid is, for example, the narrowest among the electrode layers included in the stacked body 100. The width W4*s* of the source-side selection gate SGS is wider than the width W4*w* of the bottom word line WLbtm. Similarly, the width W5*d* of the drain-side selection gate SGD also is wider than the width W5*w* of the top word line WLtop.

Also, for example, the widths (W4*w*, W5*w*, and W6) of the word lines WL along the Y-direction become narrower continuously along the Z-direction from the major surface 10*a* of the substrate 10 toward the middle portion 100M. Further, the widths (W4*w*, W5*w*, and W6) become wider continuously along the Z-direction from the middle portion 100M toward the upper surface of the stacked body 100. In the middle portion 100M, the position where the narrowing and widening of the electrode layers, e.g., the width W6 of the word line WL, switches is, for example, the position where the word line WLmid exists.

Figure 5:
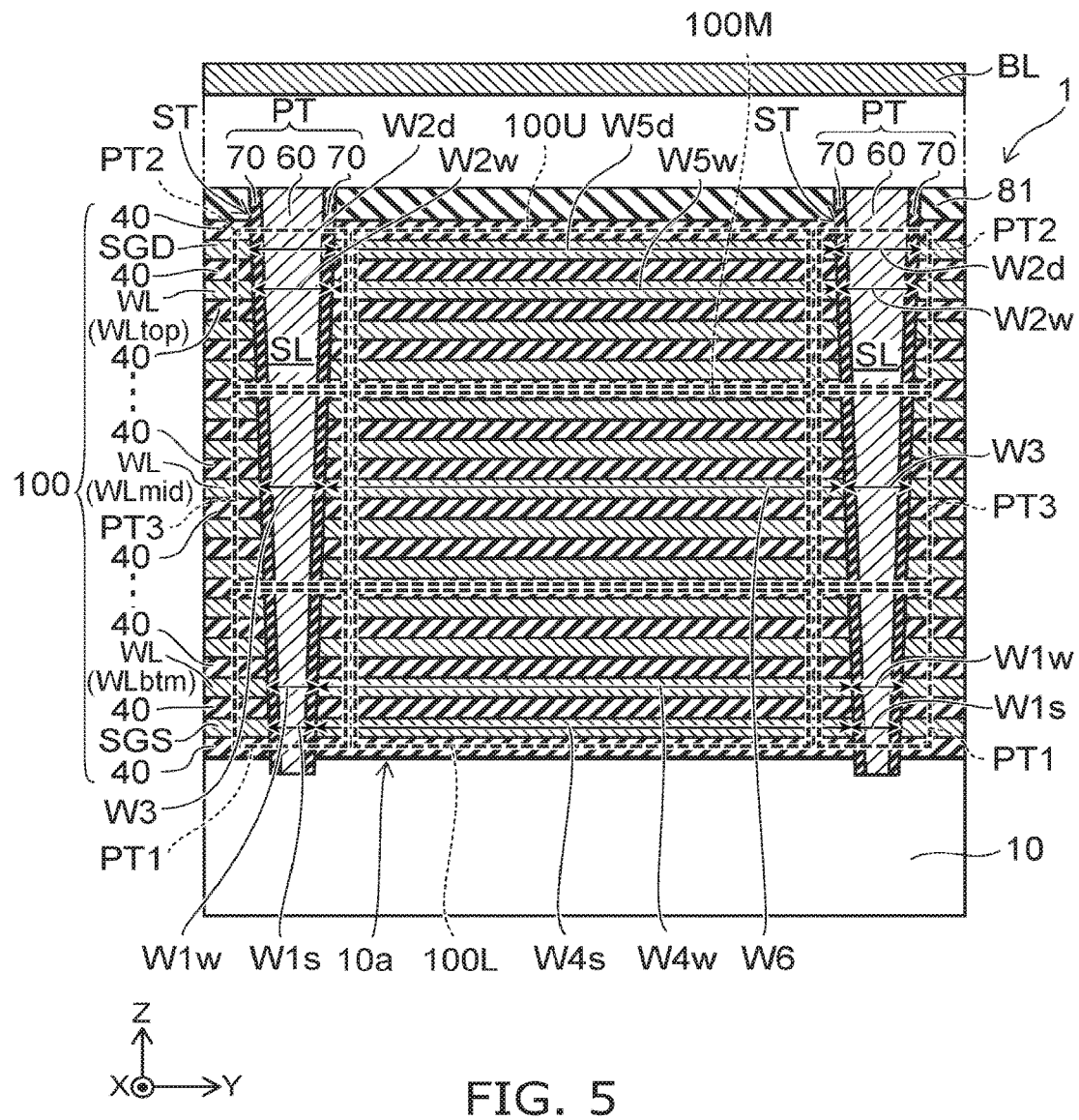
FIG. 5 is a schematic cross-sectional view of the memory cell array of a semiconductor device of a reference example.

FIG. 5 is a schematic cross-sectional view of the memory cell array 1 of a semiconductor device of a reference example. The cross section shown in FIG. 5 corresponds to the cross section shown in FIG. 4. The memory hole MH is not shown in FIG. 5.

As shown in FIG. 5, the first embodiment and the reference example differ in that the cross-sectional configuration of the plate portion PT parallel to the Y-Z plane has a forward-tapered configuration. In the plate portion PT that has the forward-tapered configuration, the width of the plate portion PT is narrow on the major surface 10*a* side of the substrate 10 and becomes wider toward the upper surface of the stacked body 100.

The widths W1 (W1*s* and W1*w*) of the first portion PT1 along the Y-direction of the plate portion PT of the reference example are narrower than the width W3 of the third portion PT3 (W1 (W1*s* and W1*w*)<W3). This configuration is similar to that of the first embodiment. However, the widths W2 (W2*d* and W2*w*) of the second portion PT2 along the Y-direction are wider than the width W3 of the third portion PT3 (W2 (W2*d* and W2*w*)>W3). Further, the width W2*d* is wider than the width W2*w*.

Also, for the electrode layers, e.g., the word lines WL, of the reference example, the width W4*w* inside the lower layer portion 100L along the Y-direction is wider than the width W6 inside the middle portion 100M. Further, the width W5*w* inside the upper layer portion 100U is wider than the width W6 inside the middle portion 100M.

In such a reference example, it can be seen from the positional relationships in both FIG. 1 and FIG. 2 that the distance between the plate portion PT and the columnar portion CL undesirably becomes shorter gradually from the lower layer portion 100L of the stacked body 100 toward the upper layer portion 100U of the stacked body 100. The width of the word line WL between the plate portion PT and the plate portion PT along the Y-direction becomes narrower gradually from the lower layer portion 100L toward the upper layer portion 100U. Therefore, a resistance value WLRs of the word line WL increases from the lower layer portion 100L to the middle portion 100M. Then, the resistance value WLRs increases further from the middle portion 100M to the upper layer portion 100U.

Conversely, in the first embodiment, the distance between the plate portion PT and the columnar portion CL reverses inside the middle portion 100M of the stacked body and becomes longer gradually from the middle portion 100M toward the upper layer portion 100U. The reference numerals "LL, LM, and LU" in FIG. 2 are the distances between the plate portion PT and the columnar portion CL. In FIG. 2, the distance "LL" is the distance in the lower layer portion 100L; the distance "LM" is the distance in the middle portion 100M; and the distance "LU" is the distance in the upper layer portion 100U.

In the first embodiment, the relationship between the distances "LL, LM, and LU" is

LL>LM<LU.

Conversely, in the reference example, although not shown, this is

LL>LM>LU.

In FIG. 2, the distance "LL" refers to the distance of the bottom word line WLbtm; the distance "LM" refers to the distance of the word line WLmid; and the distance "LU" refers to the distance of the top word line WLtop.

Further, the width of the word line WL between the plate portion PT and the plate portion PT along the Y-direction also becomes wider gradually from the middle portion 100M toward the upper layer portion 100U. Therefore, although the resistance value WLRs of the word line WL increases from the lower layer portion 100L to the middle portion 100M, the resistance value WLRs decreases conversely from the middle portion 100M to the upper layer portion 100U.

Figure 6:
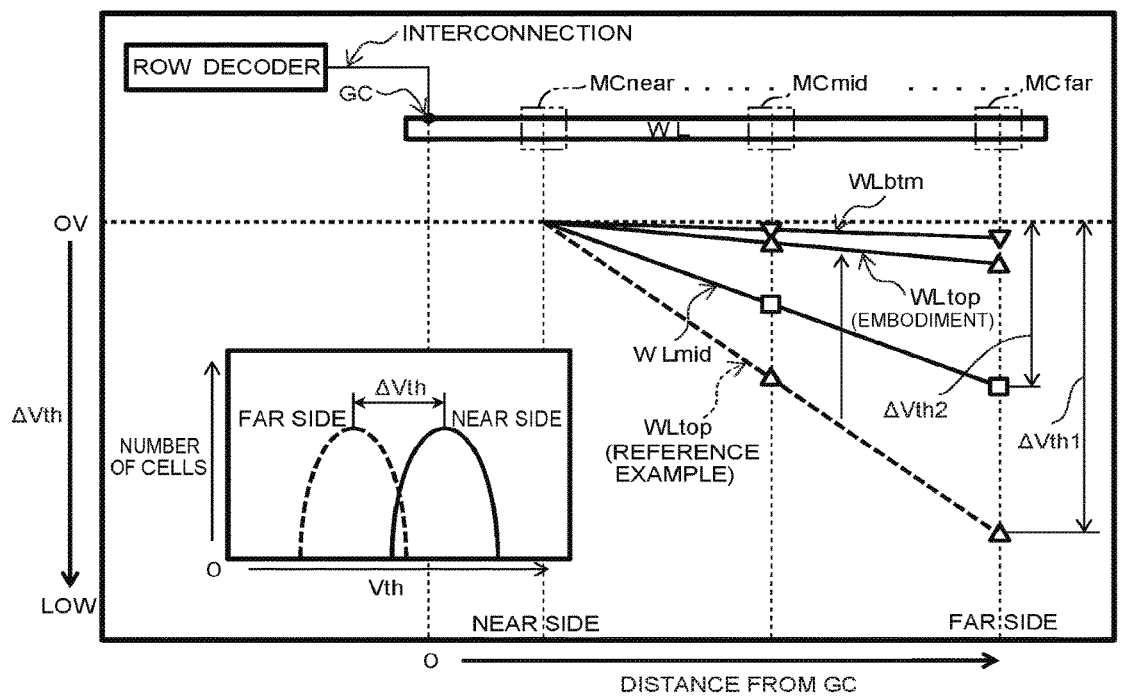
FIG. 6 is a schematic view showing the relationship between the distance from a gate contact and a difference of the threshold voltages.

FIG. 6 is a schematic view showing the relationship between the distance from a gate contact GC and a difference ΔVth of the threshold voltages. A threshold voltage Vth that shifts in one program cycle is shown in FIG. 6. However, in FIG. 6, the threshold voltage Vth is shown as the difference ΔVth between the reference value and the threshold voltage Vth, where the threshold voltage Vth that is used as the reference is set to 0 V. The memory cells MC for which the threshold voltage Vth is monitored are memory cells MCnear, MCfar, and MCmid. The memory cell MCnear is the memory cell that is most proximal to the gate contact GC. The threshold voltage Vth that is used as the reference is the threshold voltage Vth of the memory cell MCnear. The gate contact GC is the electrical contact between the interconnect and the word line WL. The interconnect connects the output of the row decoder to the word line WL. The memory cell MCfar is the memory cell that is most distal to the gate contact GC. The memory cell MCmid is the memory cell that is between the memory cell MCnear and the memory cell MCfar.

As shown in FIG. 6, after the programming, the distribution of the threshold voltages Vth of the memory cells MC shifted in one program cycle is high on the side proximal to the gate contact GC and low on the side distal to the gate contact GC. There is a tendency for the threshold voltages Vth shifted in one program cycle to decrease as the distance from the gate contact GC increases. This tendency is called "Vth distance dependence." The Vth distance dependence exists for each of the bottom word line WLbtm, the word line WLmid, and the top word line WLtop. The strength of the Vth distance dependence changes according to the magnitude of an RC time constant $\tau_{WL}$.

The Vth distance dependence is weak when the RC time constant $\tau_{WL}$ is small. Conversely, the Vth distance dependence is strong when the RC time constant $\tau_{WL}$ is large. In the reference example, the resistance value WLRs is high in the upper layer portion 100U and low in the lower layer portion 100L. Accordingly, the RC time constant $\tau_{WL}$ of the word line WL is large in the upper layer portion 100U and small in the lower layer portion 100L. In the reference example, the Vth distance dependence is stronger in the upper layer portion 100U than in the lower layer portion 100L. Therefore, a difference ΔVth1 between the threshold voltage Vth of the memory cell MCfar connected to the top word line WLtop and the threshold voltage Vth of the memory cell MCnear connected to the bottom word line WLbtm is large. When the difference ΔVth is large, the number of times the program cycle is executed increases. Therefore, it is difficult to perform the program operation at a high speed.

Compared to such a reference example, in the first embodiment, the resistance value WLRs is high in the middle portion 100M, and is lower in the lower layer portion 100L and the upper layer portion 100U than in the middle portion 100M. Accordingly, the RC time constant $\tau_{WL}$ of the word line WL is large in the middle portion 100M and small in the lower layer portion 100L and the upper layer portion 100U.

Here, it is assumed that the resistance value WLRs of the word line WLmid is the same between the reference example and the first embodiment. In the first embodiment, the resistance value WLRs decreases toward the upper layer portion 100U with the word line WLmid as a boundary. Therefore, the maximum of the difference ΔVth of the first embodiment is a difference ΔVth2 between the threshold voltage Vth of the memory cell MCfar connected to the word line WLmid and the threshold voltage Vth of the memory cell MCnear connected to the bottom word line WLbtm.

As shown in FIG. 6, the difference ΔVth2 is smaller than the difference ΔVth1. Therefore, in the first embodiment, compared to the reference example, it is possible to suppress the number of times the program cycle is executed. Accordingly, according to the first embodiment, compared to the reference example, the program operation can be performed at a high speed.

Thus, according to the first embodiment, the difference between the resistance values of the electrode layers (SGD, WL, and SGS) of the stacked body 100 can be reduced. As a result, according to the first embodiment, compared to the reference example, for example, it is possible to perform the program operation at a high speed.

<Second Embodiment>

Figure 7:
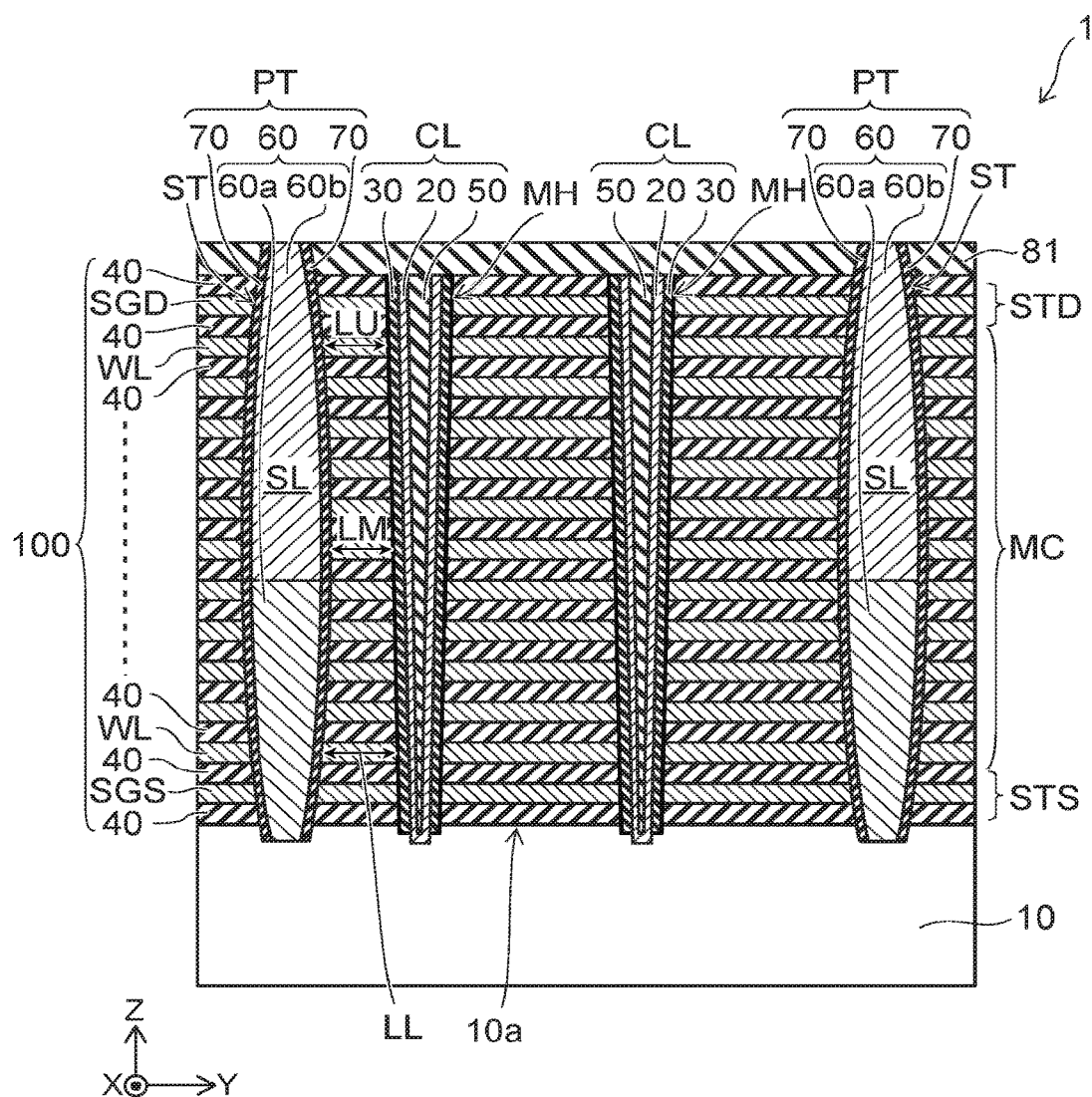
FIG. 7 is a schematic cross-sectional view of the memory cell array 1 of a semiconductor device of a second embodiment.

FIG. 7 is a schematic cross-sectional view of the memory cell array 1 of a semiconductor device of a second embodiment. The cross section shown in FIG. 7 corresponds to the cross section shown in FIG. 2.

As shown in FIG. 7, the second embodiment differs from the first embodiment in that the plate conductor 60 includes a first layer 60a and a second layer 60b. The first layer 60a is provided on the major surface 10a of the substrate 10. The second layer 60b is provided on the first layer 60a. The first layer 60a includes a first conductor. The second layer 60b includes a second conductor that is different from the first conductor. The first conductor may be a conductor that has a higher resistance value than the second conductor. In such a case, for example, the second layer 60b mainly performs the function as the source line SL. A major component included in the first layer 60a is, for example, the same as a major component included in the substrate 10. The first layer 60a includes, for example, silicon. The silicon is, for example, polysilicon made of amorphous silicon that is crystallized. The second layer 60b includes, for example, tungsten. For example, a barrier film may be provided between the first layer 60a and the second layer 60b. For example, the barrier film includes titanium, or titanium and titanium nitride.

FIG. 8 is a schematic plan view of the semiconductor device of the second embodiment. FIG. 9 is a cross-sectional view along line 9-9 of FIG. 8.

As shown in FIG. 8 and FIG. 9, on the substrate 10, the stacked body 100 includes the memory cell array 1, a first stairstep portion 2a, and a second stairstep portion 2b. Each of the first stairstep portion 2a and the second stairstep portion 2b is provided outside the memory cell array 1. For example, in the case where the planar configuration of the memory cell array 1 is a rectangular configuration, the first stairstep portion 2a and the second stairstep portion 2b are respectively provided along one set of opposite sides of the memory cell array 1.

The slit ST is provided to cross through the memory cell array 1 from the first stairstep portion 2a to the second stairstep portion 2b along the X-direction inside the stacked body 100. Thereby, similarly, the plate portion PT also is provided to cross through the memory cell array 1 from the first stairstep portion 2a to the second stairstep portion 2b.

In the second embodiment, as illustrated by arrow A1, the plate conductor 60 of the plate portion PT maintains the stacked structure including the first layer 60a and the second layer 60b at least inside the memory cell array 1. Thereby, the first layer 60a faces the major surface 10a of the substrate 10 continuously at least inside the memory cell array 1.

As illustrated by arrow A2, the stacked structure that includes the first layer 60a and the second layer 60b may be provided from one end STa of the slit ST to one other end STb of the slit ST. On the substrate 10, for example, the one end STa is on the outer side of the first stairstep portion 2a; and, for example, the one end STb is on the outer side of the second stairstep portion 2b. In such a case, the first layer 60a faces the major surface 10a of the substrate 10 from the one end STa of the slit ST to the other end STb of the slit ST.

Thus, the plate conductor 60 may have a stacked structure including at least the first layer 60a and the second layer 60b. For example, in the case where the materials are such that the thermal expansion coefficient of the first layer 60a is nearer to the thermal expansion coefficient of the substrate 10 than is the thermal expansion coefficient of the second layer 60b, compared to the case where the plate conductor 60 is only a conductor including the second layer 60b, the occurrence of "warp" in the substrate 10 and the stacked body 100 can be suppressed. According to this perspective, although the first layer 60a is a conductor in the second embodiment, the second layer 60b may be an insulator.

Also, the structure of the plate portion PT shown in FIG. 8 and FIG. 9 is applicable to the first embodiment as well.

<Third Embodiment>

Figure 10:
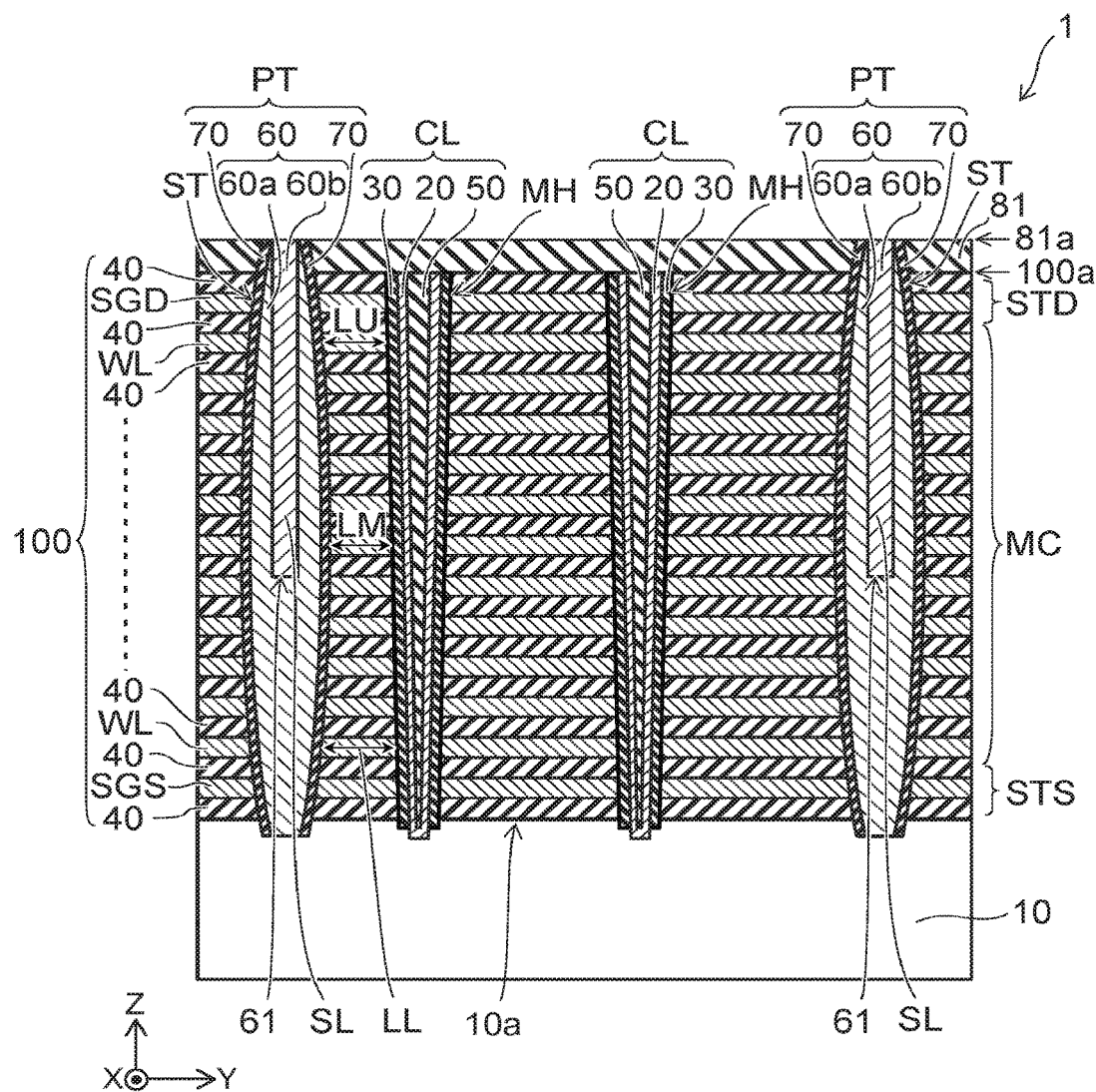
FIG. 10 is a schematic cross-sectional view of the memory cell array of a semiconductor device of a third embodiment.

FIG. 10 is a schematic cross-sectional view of the memory cell array 1 of a semiconductor device of a third embodiment. The cross section shown in FIG. 10 corresponds to the cross section shown in FIG. 7.

As shown in FIG. 10, the third embodiment differs from the second embodiment in that the first layer 60a is provided from the major surface 10a of the substrate 10 to an upper surface 100a of the stacked body 100. In the third embodiment, the first layer 60a is provided to extend past the upper surface 100a to an upper surface 81a of the insulating film 81.

Further, the first layer 60a of the third embodiment has a recess 61. The recess 61 is provided from the upper surface 100a of the stacked body 100 partway through the first layer 60a toward the major surface 10a of the substrate 10. In the third embodiment, the recess 61 is provided from the upper surface 81a of the insulating film 81 to extend past the upper surface 100a toward the major surface 10a of the substrate 10. The recess 61 extends in the X-direction along the slit ST.

The second layer 60b is provided inside the recess 61. The sidewall insulating film 70 and the first layer 60a are provided between the second layer 60b and the stacked body 100.

Thus, the second layer 60b may be provided inside the recess 61 provided in the first layer 60a. According to the third embodiment, the sidewall insulating film 70 and the first layer 60a are provided between the second layer 60b and the stacked body 100. The sidewall insulating film 70 and the first layer 60a can perform the role of a buffer member that relaxes the stress applied to the stacked body 100 by the second layer 60b. Therefore, according to the third embodiment, compared to the second embodiment, for example, the "warp" does not occur easily in the substrate 10 and the stacked body 100. Accordingly, according to the third embodiment, the advantage of being advantageous for higher integration by downscaling can be obtained.

<Fourth Embodiment>

Figure 11:
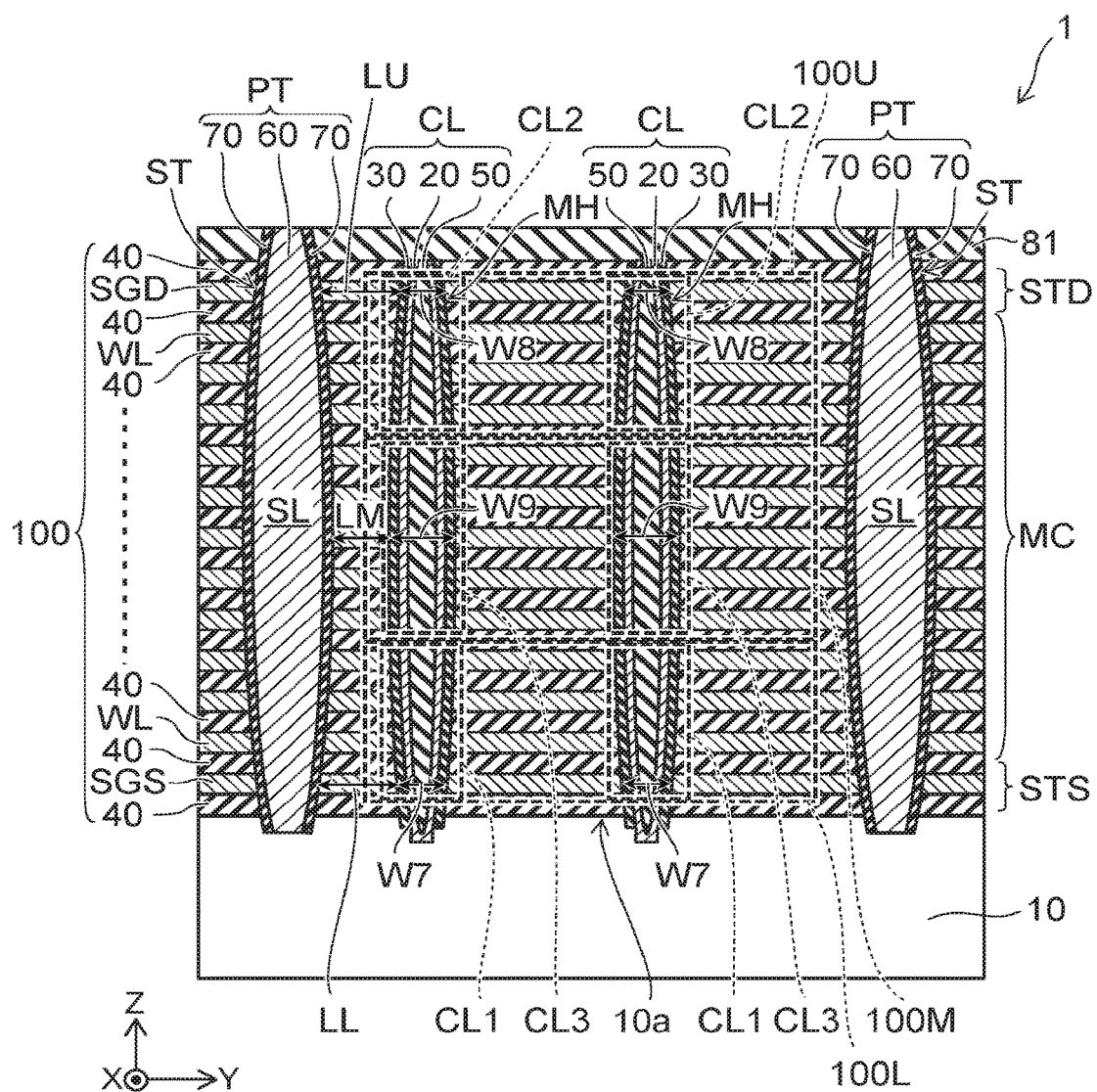
FIG. 11 is a schematic cross-sectional view of the memory cell array 1 of a semiconductor device of a fourth embodiment.

FIG. 11 is a schematic cross-sectional view of the memory cell array 1 of a semiconductor device of a fourth embodiment.

The cross section shown in FIG. 11 corresponds to the cross section shown in FIG. 2.

As shown in FIG. 11, the fourth embodiment differs from the first embodiment in that the cross-sectional configuration parallel to the Y-Z plane (the cross section along the Y-direction) of the columnar portion CL has a bowed configuration. In the fourth embodiment, the columnar portion CL includes a fourth portion CL1, a fifth portion CL2, and a sixth portion CL3 along the stacking direction of the stacked body 100 (the Z-direction). The sixth portion CL3 is provided between the fourth portion CL1 and the fifth portion CL2. A width W7 of the fourth portion CL1 along the Y-direction is narrower than a width W9 of the sixth portion CL3 along the Y-direction. Also, a width W8 of the fifth portion CL2 along the Y-direction is narrower than the width W9 of the sixth portion CL3 along the Y-direction. For example, the fourth portion CL1 is included in the lower layer portion 100L. Similarly, for example, the fifth portion CL2 is included in the upper layer portion 100U; and, for example, the sixth portion CL3 is included in the middle portion 100M.

Thus, the cross-sectional configuration of the columnar portion CL along the Y-direction may have a bowed configuration. According to the fourth embodiment, because the cross-sectional configuration of the columnar portion CL along the Y-direction has the bowed configuration, for example, compared to the first embodiment, the distance "LU" can further approach the distance "LL." Therefore, the effective width of the word line WL in the upper layer portion 100U becomes wider along the Y-direction. Accordingly, for example, compared to the first embodiment, the resistance value WLRs of the word line WL in the upper layer portion 100U can further approach the resistance value WLRs of the word line WL in the lower layer portion 100L.

Thus, according to the embodiments, a semiconductor device in which it is possible to reduce the difference between the resistance values of the electrode layers of the stacked body 100 can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a substrate having a major surface;
   a stacked body provided on the major surface of the substrate, the stacked body including a plurality of electrode layers stacked with an insulator interposed, the plurality of electrode layers including a first electrode layer, a second electrode layer, and a third electrode layer, the first electrode layer being most proximal to the major surface of the substrate, the second electrode layer being most distal to the major surface of the substrate, the third electrode layer being provided between the first electrode layer and the second electrode layer;
   a columnar portion provided inside the stacked body, the columnar portion extending along a stacking direction of the stacked body, the columnar portion including a semiconductor body and a memory film, the memory film being provided between the semiconductor body and the third electrode layer, the memory film including a charge storage portion; and
   a plate portion provided inside the stacked body, the plate portion extending along the stacking direction of the stacked body and along a first direction orthogonal to the stacking direction, the plate portion including a plate conductor and a sidewall insulating film, the sidewall insulating film being provided between the plate conductor and the stacked body, the plate portion including a first portion, a second portion, and a third portion along the stacking direction of the stacked body, the third portion being provided between the first portion and the second portion, a width of the first portion along a second direction being narrower than a width of the third portion along the second direction, the second direction being orthogonal to the first direction and being along the major surface of the substrate, a width of the second portion along the second direction being narrower than the width of the third portion along the second direction.

2. The semiconductor device according to claim 1, wherein
the first portion is adjacent to a lower layer portion of the stacked body including the first electrode layer,
the second portion is adjacent to an upper layer portion of the stacked body including the second electrode layer, and
the third portion is adjacent to a middle portion of the stacked body including the third electrode layer.

3. The semiconductor device according to claim 1, wherein
the width of the plate portion along the second direction
becomes wider continuously along the stacking direction of the stacked body from the major surface of the substrate toward the third portion, and
becomes narrower continuously along the stacking direction of the stacked body from the third portion toward an upper surface of the stacked body.

4. The semiconductor device according to claim 1, wherein
the plate conductor includes a first layer and a second layer,
the first layer is provided on the major surface of the substrate, and
the second layer is provided on the first layer.

5. The semiconductor device according to claim 4, wherein
a thermal expansion coefficient of the first layer is closer to a thermal expansion coefficient of the substrate than is a thermal expansion coefficient of the second layer.

6. The semiconductor device according to claim 1, wherein
the plate conductor includes a first layer and a second layer,
the first layer is provided from the major surface of the substrate to the upper surface of the stacked body,
the first layer has a recess provided from the upper surface of the stacked body toward the major surface of the substrate, the recess extending in the first direction, and
the second layer is provided inside the recess.

7. The semiconductor device according to claim 6, wherein
a thermal expansion coefficient of the first layer is closer to a thermal expansion coefficient of the substrate than is a thermal expansion coefficient of the second layer.

8. The semiconductor device according to claim 1, wherein
the columnar portion includes a fourth portion, a fifth portion, and a sixth portion along the stacking direction of the stacked body,
the sixth portion is provided between the fourth portion and the fifth portion,
a width of the fourth portion along the second direction is narrower than a width of the sixth portion along the second direction, and
a width of the fifth portion along the second direction is narrower than the width of the sixth portion along the second direction.

9. The semiconductor device according to claim 1, wherein
the stacked body includes a memory cell array, a first stairstep portion, and a second stairstep portion,
the first stairstep portion and the second stairstep portion are respectively provided along one set of opposite sides of the memory cell array, and
the plate portion is provided to cross through the memory cell array from the first stairstep portion to the second stairstep portion.

* * * * *